(12) United States Patent
Frolov et al.

(10) Patent No.: US 10,962,587 B2
(45) Date of Patent: Mar. 30, 2021

(54) METHOD AND SYSTEM FOR MICROWAVE MIXER PHASE RESPONSE MEASUREMENT

(71) Applicant: Fermi Research Alliance, LLC, Batavia, IL (US)

(72) Inventors: Daniil Frolov, Aurora, IL (US); Akim Babenko, Boulder, CO (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 192 days.

(21) Appl. No.: 16/203,232

(22) Filed: Nov. 28, 2018

(65) Prior Publication Data

US 2020/0166565 A1 May 28, 2020

(51) Int. Cl.
*G01R 31/28* (2006.01)
*G01R 35/00* (2006.01)
*G01R 31/3185* (2006.01)

(52) U.S. Cl.
CPC ... *G01R 31/2822* (2013.01); *G01R 31/31858* (2013.01); *G01R 35/005* (2013.01)

(58) Field of Classification Search
CPC .......... G01R 31/2822; G01R 31/31858; G01R 35/005
USPC ....................................................... 324/617
See application file for complete search history.

(56) References Cited

U.S. PATENT DOCUMENTS

| | | | |
|---|---|---|---|
| 5,434,511 A | 7/1995 | Adamian et al. | |
| 5,937,006 A | 8/1999 | Clark et al. | |
| 6,064,694 A | 5/2000 | Clark et al. | |
| 6,362,631 B1 | 3/2002 | Knox | |
| 6,448,786 B1 | 9/2002 | Dunsmore et al. | |
| 6,459,278 B1 | 10/2002 | Knox | |
| 6,690,722 B1 | 2/2004 | Dunsmore et al. | |
| 7,415,373 B2* | 8/2008 | Yanamaka | G01R 27/28 702/75 |
| 8,744,370 B2 | 6/2014 | Dunsmore | |
| 2003/0053178 A1 | 3/2003 | Karlquist | |
| 2005/0218910 A1* | 10/2005 | Iwasaki | H03F 3/602 324/650 |
| 2006/0084426 A1* | 4/2006 | Anderson | G01R 27/28 455/423 |

(Continued)

FOREIGN PATENT DOCUMENTS

| | | |
|---|---|---|
| RU | 2524049 C1 | 7/2014 |
| RU | 2621368 C1 | 6/2017 |

OTHER PUBLICATIONS

Vyzulin S.A., Korotkov K.S. To The New Phase Shifts in Mixer Measurement Method. In: Groll H., Nedkov I. (eds) Microwave Physics and Techniques; NATO ASI Series (3. High Technology), vol. 33.; (1997).

*Primary Examiner* — Steven L Yeninas
(74) *Attorney, Agent, or Firm* — Loza & Loza LLP; Kevin L. Soules (57) ABSTRACT

A system, method and apparatus for mixer phase response measurement comprises a vector network analyzer connectable to a device under test, an additional device connected to the analyzer the additional device configured to have an equal phase response to that of the device under test, a local oscillator connected to the device under test and the additional device, a series of switches connecting the device under test and the additional device to a vector voltmeter, and a reference generator connected to the vector voltmeter.

12 Claims, 9 Drawing Sheets

(56) References Cited

U.S. PATENT DOCUMENTS

| | | | | |
|---|---|---|---|---|
| 2009/0096477 A1* | 4/2009 | Forstner | ............... | G01S 7/032 |
| | | | | 324/754.31 |
| 2009/0184721 A1* | 7/2009 | Albert-Lebrun | ....... | G01R 27/32 |
| | | | | 324/601 |
| 2009/0276177 A1* | 11/2009 | Nakayama | ............. | G01R 27/28 |
| | | | | 702/85 |
| 2010/0141239 A1* | 6/2010 | Ortler | ............... | G01R 35/005 |
| | | | | 324/76.39 |
| 2011/0288820 A1* | 11/2011 | Bednorz | ............... | H04B 3/462 |
| | | | | 702/176 |
| 2014/0306719 A1* | 10/2014 | Dunsmore | ........... | G01R 35/005 |
| | | | | 324/601 |
| 2016/0077196 A1* | 3/2016 | Dehlink | ............. | G01R 31/2822 |
| | | | | 342/169 |

\* cited by examiner

METHOD AND SYSTEM FOR MICROWAVE MIXER PHASE RESPONSE MEASUREMENT

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of signal mixing. Embodiments are further related to the field of microwave signal technology. Embodiments are also related to modulation and manipulation of signals. Embodiments are further related to characterization of the phase response of frequency translating devices. Embodiments are also related to characterization of the group delay response of frequency translating devices. Embodiments are also related to methods, systems, and devices for measuring microwave mixer phase response.

BACKGROUND

Microwave signals with phase modulation and/or manipulation are widely used in communications, navigation, and avionics systems, as well as in radar and various target detection systems. Microwave signals have notable applications in the space industry because of their ability to penetrate the ionosphere. Furthermore, microwave signals are used to control and read out states of superconducting qubits, to program quantum computers. Most modern electronic systems use digital signal processing that operates with relatively low frequencies because of limitations associated with analog-to-digital converters. Microwave mixers are used to translate the frequency of carrier signals from microwaves to lower frequency bands where intermediate frequency signals can be digitized. Almost all modern electronic communication devices, from cell phones to satellite transceivers, contain microwave mixers in their structure.

An example of a typical microwave system, that is based on phase modulation of microwave signals, is a phased array with multiple cells. Each cell of such an antenna contains a transceiver that has a microwave mixer used to convert analog microwave signals to lower frequency. Performance of microwave mixers in such devices is very important, because it directly impacts the information the microwave signals carry. For example, in radar systems the phase distortion caused by microwave mixers can result in incorrect target identification.

One of the most difficult challenges facing quantum researchers is sourcing the very precise microwave signals needed to understand and evaluate the behavior of quantum gates. These signals are usually generated at low frequencies and then converted to high frequencies with microwave mixers. However, these mixers suffer from distortion created in the output microwave waveforms that reduce quantum gate fidelity.

For linear microwave devices that do not employ frequency conversion (e.g. filters, attenuators, linear amplifiers etc.) the phase response measurement is well defined and such measurements can be easily done with a conventional vector network analyzer (VNA). However, microwave mixers, by nature, have signals with different frequencies on the input and output ports. It is therefore impossible to measure their phase response with conventional methods.

Several measurement techniques have been proposed. However, these methods suffer from a number of drawbacks. For example, the phase response of a mixer can be determined by measuring the phase response of the mixer under test as compared to an additional mixer connected both in series and in parallel. Such a method requires an additional intermediate frequency generator, and the unknown phase response of this generator increases the error of the mixer under test phase response measurement. Similar methods where no additional intermediate frequency generator is required, introduce errors based on delays in local oscillator (LO) channels.

In other prior art approaches measurement of the phase response of a mixer under test and two additional mixers, connected in series, in pairs, in three different combinations has been proposed. However, such approaches still suffer from errors associated with the delay in local oscillator channels. The problem is even more complicated because the electrical delay of the local oscillator channels between two mixers in each of the three combinations has to be matched.

In another example, the phase response of the mixer under test can be determined by measuring the reflected wave on the mixer's input, with three known standards connected to the mixer's output, and solving the resulting equations. However, the magnitude-to-phase modulation in the mixer under test creates errors in this method, because of the difference in magnitude between the forward and reflected waves.

In yet another approach, the phase response of the mixer under test can be measured relative to a phase reference, based on a comb generator with a known phase distribution between harmonics. The accuracy of this method depends on the performance of the comb generator. This can be problematic because the linearity of the phase distribution between harmonics decreases at certain frequencies and is hard to measure.

As illustrated in the examples above, test systems and methods for microwave mixer phase response measurement have errors that are higher than those in the conventional systems for linear devices' phase response measurement. It would be desirable to improve accuracy and provide results that have a traceable standard. Accordingly, there is a need in the art for methods and systems to improve microwave mixer response measurement as described in the embodiments disclosed herein.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method, system, and apparatus for response measurement.

It is another aspect of the disclosed embodiments to provide a method, system, and apparatus for microwave response measurement.

It is another aspect of the disclosed embodiments to provide a method, system, and apparatus for microwave phase response measurement.

It is another aspect of the disclosed embodiments to provide a method, system, and apparatus for microwave mixer response measurement.

It is another aspect of the disclosed embodiments to provide systems and methods for characterizing the response (e.g. phase response), and consequently the group delay response, of a frequency translating device such as a mixer or frequency converter.

In the embodiments disclosed herein, a system can comprise an analyzer connectable to a device under test, an additional device connected to the analyzer and connected to the device under test, a local oscillator connected to the device under test and the additional device, and at least one switch connecting the device under test and the additional device to a vector voltmeter. In an embodiment, the system further comprises a reference generator connected to the vector voltmeter. In an embodiment, the at least one switch comprises at least three switches. In an embodiment, the device under test comprises a mixer and the additional device comprises an additional mixer. In an embodiment, the mixer comprises a microwave mixer and the additional mixer comprises an additional microwave mixer. In an embodiment, the analyzer comprises a vector network analyzer.

In an embodiment, the system further comprises at least one processor, and a storage device communicatively coupled to the at least one processor, the storage device storing instructions which, when executed by the at least one processor, cause the at least one processor to perform operations comprising: receiving response data from the analyzer, calculating a response of the device under test, and displaying the calculated response of the device under test.

In another embodiment a method comprises measuring a forward sum of a response of a device under test and an additional device, interchanging a position of the device under test and the additional device, measuring a reverse sum of a response of the device under test and the additional device, and calculating a response of the device under test. In an embodiment, the method further comprises measuring a forward test channel response with the device under test connected and measuring a forward reference channel response with the additional device connected.

In an embodiment, the method further comprises measuring a test channel response with the additional device connected and measuring an IF channel response. In an embodiment, the method further comprises calibrating the measurement system. In an embodiment, the device under test comprises a mixer and the additional device comprises an additional mixer. In an embodiment, the mixer comprises a microwave mixer and the additional mixer comprises an additional microwave mixer.

In yet another embodiment a method comprises: measuring a forward sum of a response of a device under test and an additional device, measuring a forward test channel response with the device under test connected, measuring a forward reference channel response with the additional device connected, interchanging a position of the device under test and the additional device, measuring a reverse sum of a response of the device under test and the additional device, measuring a test channel response with the additional device connected, measuring an IF channel response, and calculating a response of the device under test. In an embodiment, the method further comprises calibrating the measurement system.

In an embodiment, the response comprises a phase response. In an embodiment, the response comprises a magnitude response. In an embodiment, the device under test comprises a mixer and the additional device comprises an additional mixer. In an embodiment, the mixer comprises a microwave mixer and the additional mixer comprises an additional microwave mixer. In an embodiment, the method further comprises displaying the calculated response of the device under test with a computer system.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in the following non-limiting examples can be varied, and are cited merely to illustrate one or more embodiments and are not intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Figure 1:
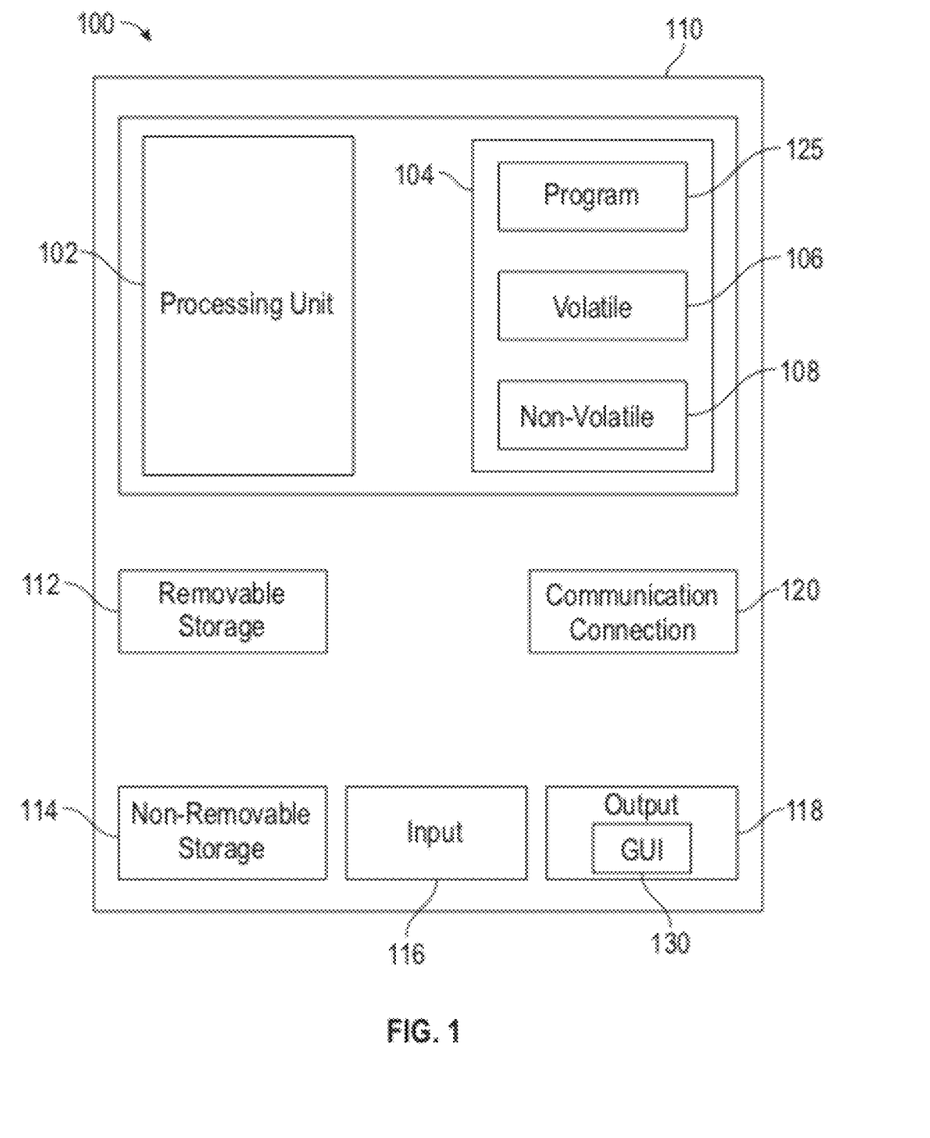
FIG. 1 depicts a block diagram of a computer system which is implemented in accordance with the disclosed embodiments.
Figure 2:
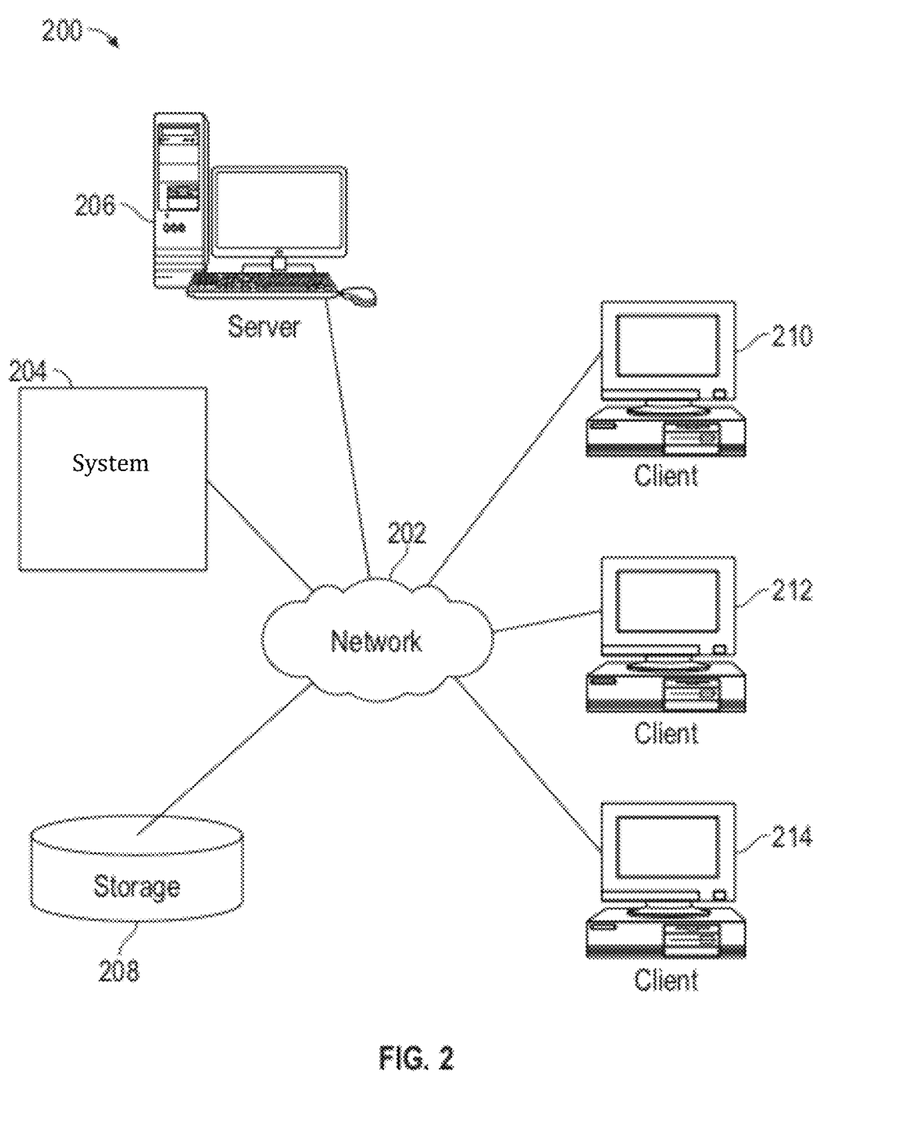
FIG. 2 depicts a graphical representation of a network of data-processing devices in which aspects of the present embodiments may be implemented.
Figure 3:
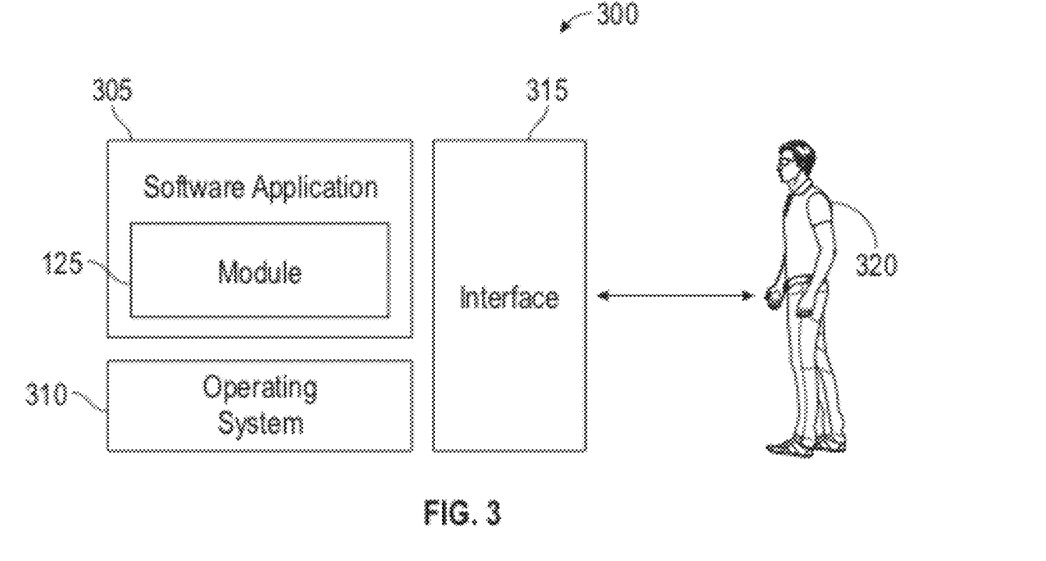
FIG. 3 illustrates a computer software system for directing the operation of the data-processing system depicted in FIG. 1, in accordance with an example embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing parts of the methods and systems disclosed herein is shown in FIG. 1. A computing device in the form of a computer 110 configured to interface with controllers, peripheral devices, and other elements disclosed herein may include one or more processing units 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage as described herein includes, for example, disc storage, disk storage, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Discs (DVD) or other optical disc storage, magnetic cassettes, magnetic tape, magnetic disk storage, or other magnetic storage devices, or any other medium capable of storing computer-readable instructions as well as data including image data.

Computer 110 may include, or have access to, a computing environment that includes input 116, output 118, and a communication connection 120. The computer may operate in a networked environment using a communication connection 120 to connect to one or more remote computers, remote sensors and/or controllers, detection devices, handheld devices, multi-function devices (MFDs), speakers, mobile devices, tablet devices, mobile phones, Smartphone, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 2 below.

Output 118 is most commonly provided as a computer monitor, but may include any output device. Output 118 and/or input 116 may include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user, and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module or node 125, which can be representative of other modules or nodes described herein, are stored on a computer-readable medium and are executable by the processing unit 102 of computer 110. Program module or node 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 can be a network of computers or other such devices, such as mobile phones, smart phones, sensors, controllers, speakers, tactile devices, and the like, in which embodiments of the present invention may be implemented. Note that the system 200 can be implemented in the context of a software module such as program module 125. The system 200 includes a network 202 in communication with one or more clients 210, 212, and 214. Network 202 may also be in communication with one or more external devices 204, servers 206, and storage 208. Network 202 is a medium that can be used to provide communications links between various devices and computers connected together within a networked data processing system such as computer system 100. Network 202 may include connections such as wired communication links, wireless communication links of various types, and fiber optic cables. Network 202 can communicate with one or more servers 206, one or more external devices 204 such as multifunction device, test system, etc., and a memory storage unit such as, for example, memory or database 208. It should be understood that external device 204 may be embodied as a multifunction device, rendering machine, test system, frequency device, vector network analyzer, or other such test system device.

In the depicted example, external device 204, server 206, and clients 210, 212, and 214 connect to network 202 along with storage unit 208. Clients 210, 212, and 214 may be, for example, personal computers or network computers, handheld devices, mobile devices, tablet devices, smart phones, personal digital assistants, printing devices, recording devices, speakers, MFDs, etc. Computer system 100 depicted in FIG. 1 can be, for example, a client such as client 210 and/or 212 and/or 214.

Computer system 100 can also be implemented as a server such as server 206, depending upon design considerations. In the depicted example, server 206 provides data such as boot files, operating system images, applications, and application updates to clients 210, 212, and/or 214. Clients 210, 212, and 214 and external device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet, with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) or node(s) 125, may be "loaded" (i.e., transferred from removable storage 114 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, handheld devices, mobile phones, smart phones, tablet devices multi-processor systems, microcontrollers, printers, copiers, fax machines, multi-function devices, data networks, microprocessor-based or programmable consumer electronics, networked personal computers, minicomputers, mainframe computers, servers, medical equipment, medical devices, and the like.

Note that the term "module" or "node" as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" type system, such as Microsoft Windows®. It can be appreciated, of course, that other types of systems are possible. For example, rather than a traditional "windows" system, other operation systems such as, for example, a real-time operating system (RTOS) more commonly employed in wireless systems may also be employed with respect to operating system 310 and interface 315. The software application 305 can include, for example, module(s) 125, which can include instructions for carrying out steps or logical operations such as those shown and described herein.

The following description is presented with respect to embodiments of the present invention, which can be embodied in the context of, or require the use of, a data-processing system such as computer system 100, in conjunction with program module 125, and data-processing system 200 and network 202 depicted in FIGS. 1-3. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Windows, Macintosh, UNIX, LINUX, Android, Arduino and the like. Therefore, the descriptions of the exemplary embodiments, which follow, are for purposes of illustration and not considered a limitation.

The embodiments disclosed herein are drawn to methods and systems for improved microwave mixer response measurement. More Specifically, the disclosed embodiments relate to systems and methods for characterizing a response (e.g. phase response) and/or group delay response of a frequency translating device such as a mixer or frequency converter.

In the following embodiments, examples are presented which make use of a vector network analyzer calibrated to determine the phase response of a device under test (DUT). The DUT can be a single mixer or a complex multi-stage frequency translating device. The examples presented herein make use of a single mixer under test (MUT), but this is meant for illustrative purpose. Those skilled in the art will recognize that these embodiments can be used for many other purposes and can be achieved with various other devices.

For example, the embodiments disclosed herein describe phase measurements. However, those skilled in the art will recognize that the same approach can be used for measurement of other characteristics such as magnitude response of the mixer under test. The methods and systems for other such applications are substantially equivalent to those described herein, with the "phases" in formulas presented, being replaced by "magnitudes," summation and subtraction operations replaced with multiplication, and division by 2 being replaced by calculation of a square root.

Figure 4A:
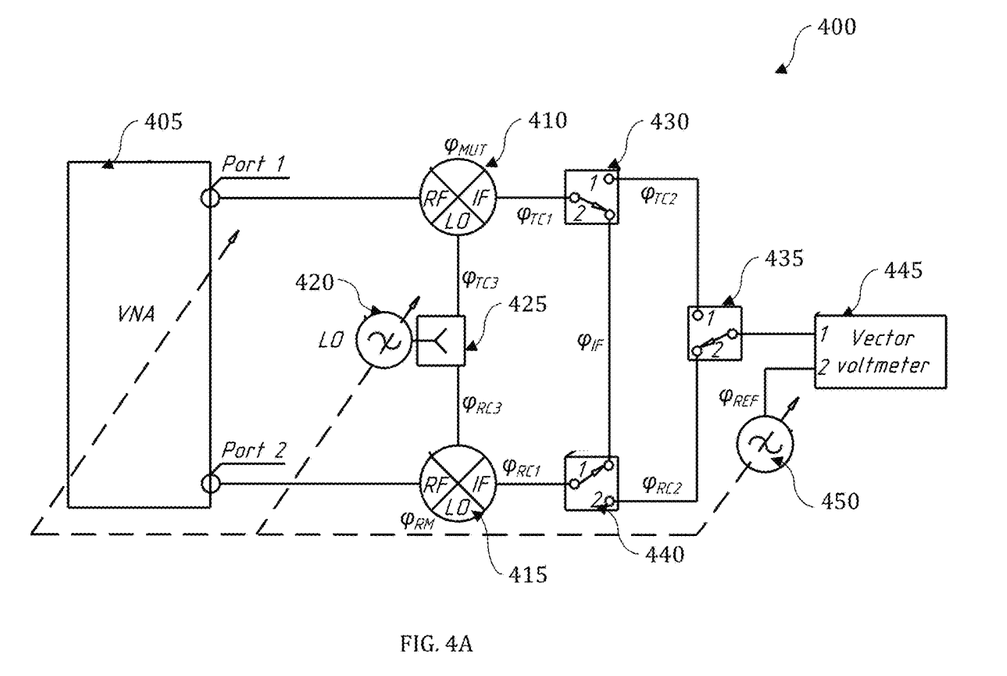
FIG. 4A depicts a diagram of system for measuring a response, in accordance with the disclosed embodiments.

FIG. 4A illustrates a system 400 for characterizing the phase response and group delay response of a frequency translating device, in accordance with the disclosed embodiments. For example, the system 400 can be used to directly measure the forward and reverse sum phase responses of a test device 410, which can comprise, for example a mixer or other such device, and an additional device 415, such as for example, an additional mixer or other such device. The system 400 can also be used for measuring the phase response of an intermediate frequency channel associated with the test device 410, in accordance with the disclosed embodiments.

Referring to FIG. 4A, the system 400 comprises a vector network analyzer 405 connected to the radio frequency port of the test device 410, and to the radio frequency port of the additional device 415. Local oscillator (LO) 420 can be connected to the local oscillator port of the test device 410 and the additional device 415 via a power divider 425. The IF ports of test device 410 and the additional device 415 are connected to the first switch 430, the second switch 435 and the third switch 440. The switches 430, 435, and 440 are used to reduce the number of reconnections at radio frequency ranges when the system 400 is being used. The third switch 440 can be connected to a vector voltmeter 445, which can be used as a phasemeter to compare the phase responses of the test device 410 and/or the additional device 415, and a reference generator 450, also connected to the vector voltmeter 445.

Figure 4B:
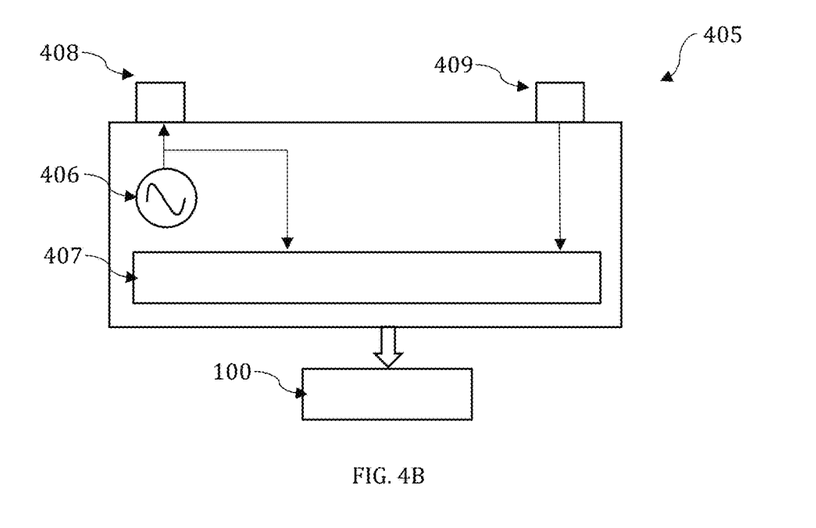
FIG. 4B depicts a diagram of vector network analyzer, in accordance with the disclosed embodiments.

A vector network analyzer 405 is illustrated in FIG. 4B. In general, a vector network analyzer, such as vector network analyzer 405 comprises an integrated source 406, for generating a stimulus signal applied to either the test device 410 or the additional device 415. The integrated source 406 generates a known stimulus signal. The vector network analyzer also has an integrated receiver 407 for comparison of the forward, scattered and reflected signals.

More specifically, the vector network analyzer 405 can measure the signal reflected from the input side 408, and the signal provided from the device under test on the output side 409. The signals can be compared using the known signal generated by the source 406. The results can then be processed and displayed by a computer system, such as computer system 100, or other such computing system.

In the embodiment illustrated in FIG. 4A, a two-port vector network analyzer is illustrated but a vector network analyzer with a different number of ports can be used, for example, to provide a signal without the need to employ an external local oscillator, such as local oscillator 420. In certain embodiments, the vector network analyzer 405 can be calibrated using conventional two-port calibration techniques.

Figure 5:
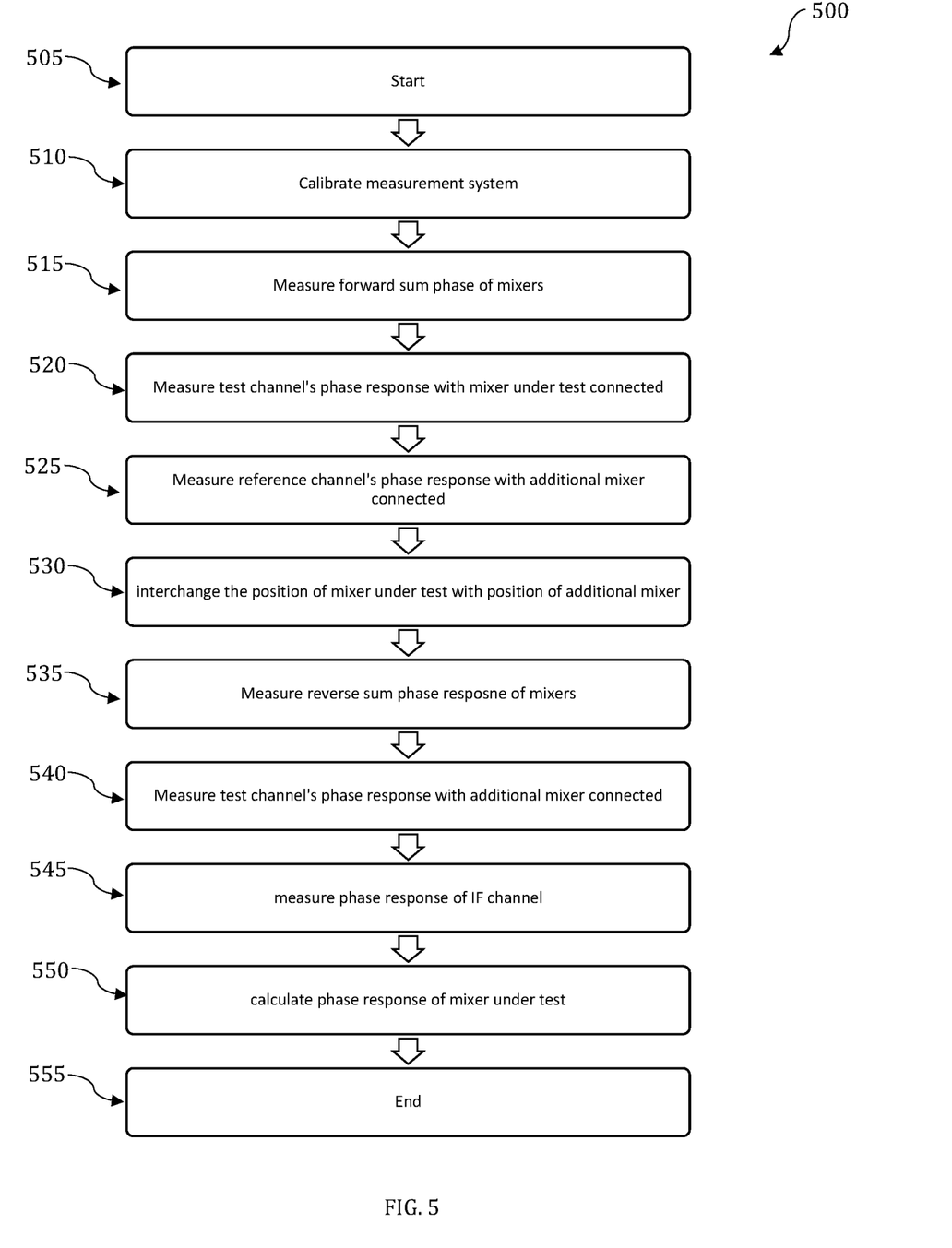
FIG. 5 depicts flow chart of steps associated with a method for measuring a response, in accordance with the disclosed embodiments.

The system 400 illustrated in FIG. 4A can be used to implement a method 500 illustrated in FIG. 5. The method begins at 505.

The first step is to calibrate the measurement system 400 as shown at 510. The step 510 can include calibrating a vector network analyzer 405 with any of a number of known techniques.

Once the measurement system 400 is calibrated, at step 515, the system 400 can be used to measure a forward sum phase response of one or more devices (e.g. mixers). As illustrated by system 400 in FIG. 4A, step 515 can be accomplished by measuring the sum phase responses of the test device 410 (with a phase response represented by "$\varphi_{MUT}$") and additional device 415 (with a phase response represented by "$\varphi_{AM}$"). Note that the test device 410 and additional device 415 are connected via IF networks with a phase response ($\varphi_{TC1}+\varphi_{IF}+\varphi_{RC1}$) by means of the first switch 430 in the second position and the second switch 435 in the first position.

However, according to further embodiments, a phase response ($\varphi_{RC1}+\varphi_{IF}+\varphi_{TC1}$) can be multiplied by a sign function of the difference between an RF frequency, and an LO frequency, $f_{LO}$, namely, $\text{sgn}(f_{RF}-f_{LO})$. The phase responses of an LO signal path to the LO ports of the test device 410 and additional device 415 can be written as $-\varphi_{TC3}$ and $\varphi_{RC3}$, respectively. Since the phase response of the LO 420 can be set arbitrarily, $\varphi_{TC3}$ and $\varphi_{RC3}$ can each be positive or negative. However, it is required for them to have opposite signs when a mixer works as a down- and up-converter. Thus, according to these definitions the vector network analyzer 405 in the system 400 can measure a forward sum phase response of mixers, given as "$\varphi(S_{21})$" according to equation (1).

$$\varphi(S_{21})=\varphi_{MUT}-\varphi_{TC3}+(\varphi_{TC1}+\varphi_{IF}+\varphi_{RC1})\cdot\text{sgn}(f_{RF}-f_{LO})+\varphi_{AM}+\varphi_{RC3} \quad (1)$$

Next, at step 520, the method includes a step wherein the system 400 measures the test channel's phase response with the test device 410 connected. In accordance with the systems and methods disclosed herein, the term "test channel" can represent the path from the test device's (i.e. mixer's) IF port to the input of the vector voltmeter 445 through the first switch 430 in the first position and the third switch 440 in the first position. The vector voltmeter 445 can measure a test channel's phase response ($\varphi_{TC1}+\varphi_{TC2}$) relative to an arbitrary phase response $\varphi_{REF}$ generated by the reference generator 450 clocked to both the local oscillator 420 and the vector network analyzer 405. A stimulus RF signal can be provided from the vector network analyzer 405 to the test device 410. The local oscillator signal is generated by the local oscillator 420 and can be applied to the LO port of the test device 410 via the power divider 425. An IF signal is then generated by the test device 410 with a phase response given as ($\varphi_{MUT}-\varphi_{TC3}$). Accordingly, a measured test channel's phase response $\varphi_{TC(MUT)}$ with the test device 410 connected, is described by equation (2):

$$\varphi_{TC(MUT)}=\varphi_{MUT}-\varphi_{TC3}+\varphi_{TC1}+\varphi_{TC2}-\varphi_{REF} \quad (2)$$

Next, at step 525, the system 400 can be used to measure a reference channel's phase response with additional device (i.e. additional mixer) 415 connected. As above, the reference channel can represent the path from the device's IF port to the input of the vector voltmeter 445 through the second switch 435 in the second position and the third switch 440 in the second position. The vector voltmeter 445 can measure a test channel's phase response, given by ($\varphi_{RC1}+\varphi_{RC2}$), relative to an arbitrary phase response, given by $\varphi_{REF}$, of the reference generator 450. An IF signal can then be generated by the additional device 415 with the phase response given as ($\varphi_{RM}-\varphi_{RC3}$). Accordingly, a measured reference channel's phase response $\varphi_{RC}$ with an additional device 415 connected, is described by equation (3):

$$\varphi_{RC}=\varphi_{AM}-\varphi_{RC3}+\varphi_{RC1}+\varphi_{RC2}-\varphi_{REF} \quad (3)$$

The next step in the method 500 is to interchange the position of the test device 410 with the position of the additional device 415, as illustrated at step 530. Once the devices are interchanged, the reverse sum phase response of the mixers can be measured as shown at 535. This step can be accomplished by measuring the sum phase responses of test device 410, with a phase response given by $\varphi_{MUT}$, and the additional device 415, with a phase response given by $\varphi_{AM}$, where the phase response is given by ($\varphi_{RC1}+\varphi_{IF}+\varphi_{TC1}$). The test device 410 and additional device 415 are connected via IF networks, by means of the first switch 430 in the second position and the second switch 435 in the first position. The phase response ($\varphi_{RC1}+\varphi_{IF}+\varphi_{TC1}$) can be multiplied by a sign function, namely, $\text{sgn}(f_{RF}-f_{LO})$. Additionally, the phase responses of the local oscillator signal path to the local oscillator ports of the test device 410 and the additional device 415 can be written as $-\varphi_{RC3}$ and $\varphi_{TC3}$, respectively. Thus, with the definitions above, the vector network analyzer 405 in the system 400 can measure a reverse sum phase response of the mixers $\varphi(S_{12})$ as the sum in equation (4), as follows:

$$\varphi(S_{12})=\varphi_{MUT}-\varphi_{RC3}+(\varphi_{RC1}+\varphi_{IF}+\varphi_{TC1})\cdot\text{sgn}(f_{RF}-f_{LO})+\varphi_{AM}+\varphi_{TC3} \quad (4)$$

The method 500 continues at step 540 where the test channel's phase response with the additional device 410 connected, can be measured. The test channel, can be defined as described at step 520. The vector voltmeter 445 can measure a test channel's phase response ($\varphi_{TC1}+\varphi_{TC2}$) relative to an arbitrary phase response $\varphi_{REF}$ generated by the reference generator 450. A stimulus RF signal can be provided by the vector network analyzer 405 to a device (i.e. mixer). An LO signal generated by the local oscillator 420, can be applied to the LO port of the device through the power divider 425. An IF signal is then generated by additional device 415 with a phase response of ($\varphi_{AM}-\varphi_{TC3}$). Accordingly, the measured test channel's phase response with the additional device connected $\varphi_{TC(AM)}$ is described by equation (5) as follows:

$$\varphi_{TC(AM)}=\varphi_{AM}-\varphi_{TC3}+\varphi_{TC1}+\varphi_{TC2}-\varphi_{REF} \quad (5)$$

Figure 6:
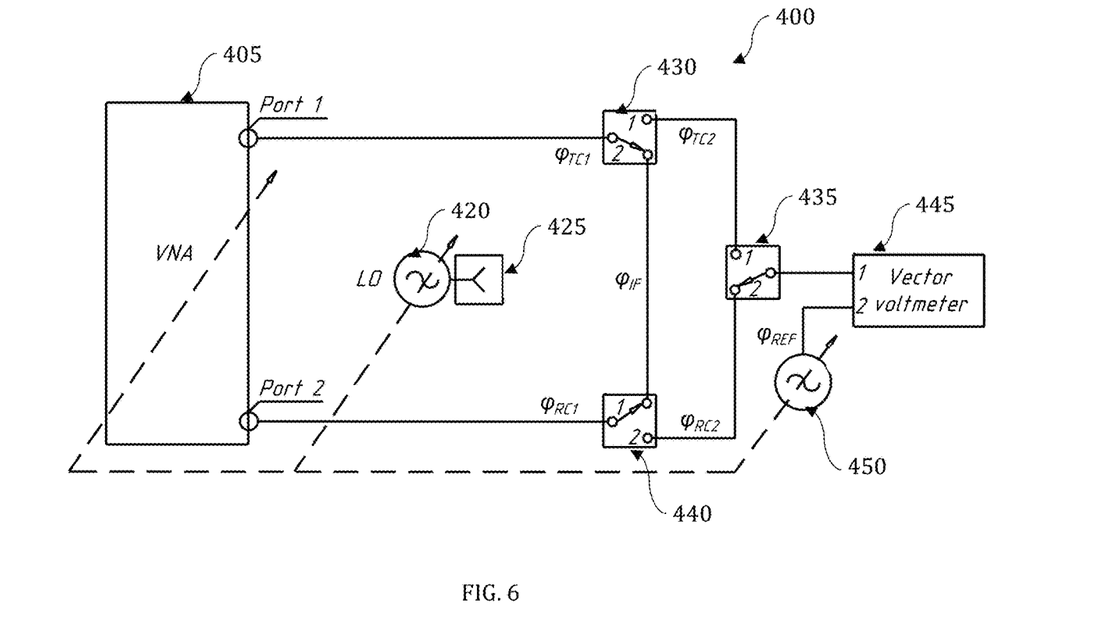
FIG. 6 depicts a diagram of a system for measuring a response, in accordance with disclosed embodiments.

At step 545, the method 500 includes using the system 400 to measure a phase response of an IF channel ($\varphi_{TC1}+\varphi_{IF}+\varphi_{RC1}$) by means of the vector network analyzer 405. As illustrated in FIG. 6, the calibrated vector network analyzer 405 can measure a phase response $\varphi(S_{21IF})$. FIG. 6 is provided to illustrate the positions of the first switch 430 and the second switch 435. In accordance with method step 545, the measured value can be defined by equation (6) as follows:

$$\varphi(S_{21IF})=\varphi_{TC1}+\varphi_{IF}+\varphi_{RC1} \quad (6)$$

Finally, at step 550, the system 400 can be used to calculate the phase response of test device 410. First, the sum $\varphi_\Sigma=\varphi_{MUT}+\varphi_{AM}$ can be calculated using equation (1), equation (4), and equation (6) as shown in equation (7), as follows:

$$\varphi_\Sigma = \frac{\varphi(S_{21}) + \varphi(S_{12}) - 2\varphi(S_{21IF})}{2} \quad (7)$$

Figure 7:
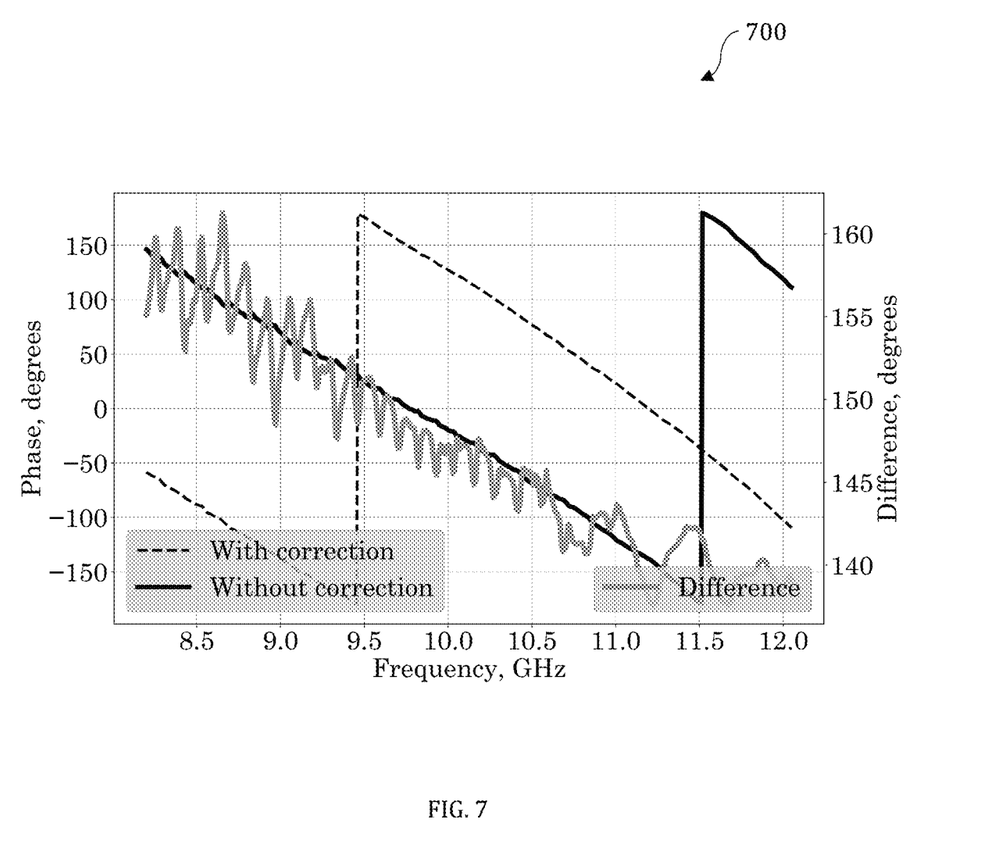
FIG. 7 depicts a chart of phase as a function of frequency, in accordance with disclosed embodiments.

FIG. 7 includes a chart 700 that illustrates the difference between phase responses with and without subtracting phase responses $(-\varphi_{TC3}+\varphi_{RC3})$ and $[(\varphi_{TC1}+\varphi_{IF}+\varphi_{RC1})\cdot\text{sgn}(f_{RF}-f_{LO})]$, in accordance with the disclosed embodiments.

The chart 700 was created using an 8.200-12.050 GHz range as the RF frequency range provided by a vector network analyzer, such as vector network analyzer 405, and an 8.220-12.070 GHz range used as the LO frequency range provided by local oscillator, such as local oscillator 420, clocked with the vector network analyzer. In this example, this combination enabled a fixed 20 MHz IF frequency.

From equations (3) and (5) and according to method 500 the difference between phase responses of a test channel and reference channel $\Delta_{CH}$ can be determined as given by equation (8), as follows:

$$\Delta_{CH}=\varphi_{TC(AM)}-\varphi_{TC} \quad (8)$$

From equations (2) and (8), and according to method 500, the difference $\varphi_\Delta$ between the phase responses of the test device 410 (e.g. the mixer under test) and the additional device (e.g. the additional mixer) can be determined by equation (9).

$$\varphi_\Delta = \varphi_{TC(MUT)} - \varphi_{RC} - \Delta_{CH} \qquad (9)$$

Figure 8:
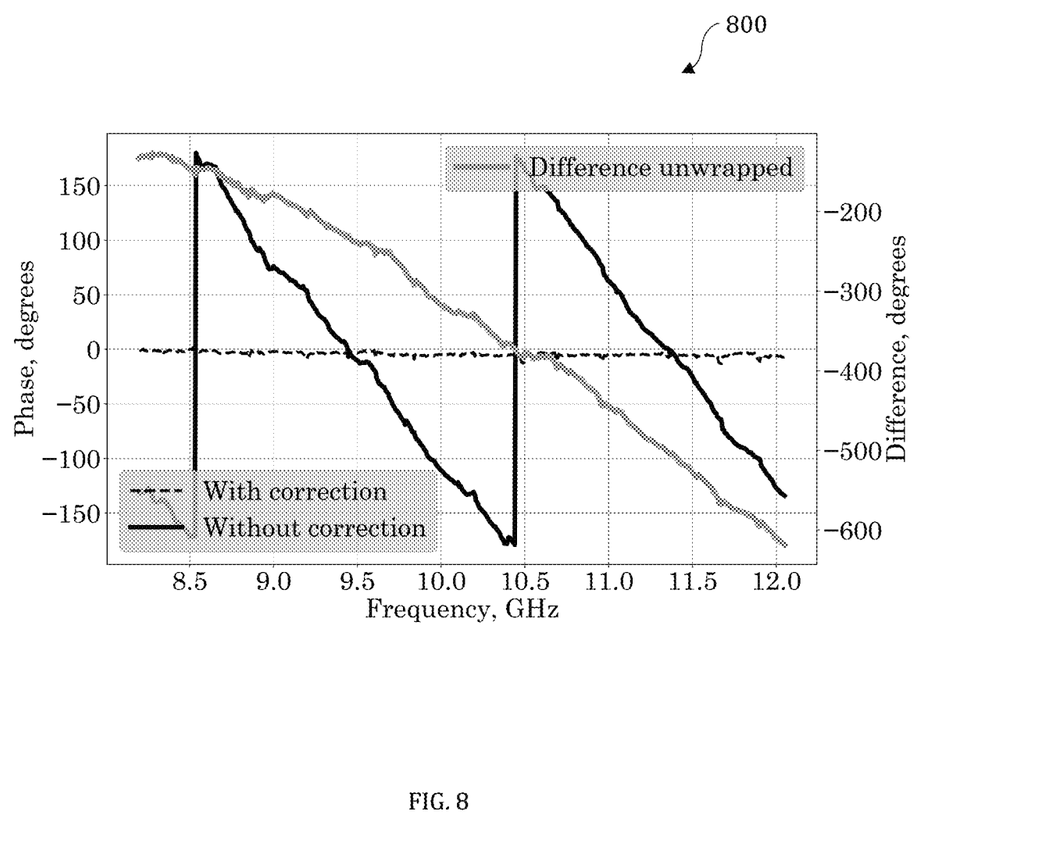
FIG. 8 depicts another chart of phase as a function of frequency, in accordance with disclosed embodiments.

FIG. 8 provides a chart 800, illustrative of the difference between phase responses with and without subtracting the phase responses $(-\varphi_{TC3}+\varphi_{TC1}+\varphi_{TC2})$ and $(-\varphi_{RC3}+\varphi_{RC1}+\varphi_{RC2})$ in accordance with the disclosed embodiments. In this example, the same frequency grid as provided FIG. 7 is shown. A phase response of a test device (e.g. a mixer under test) can be calculated according to equation (10) as follows:

$$\varphi_{MUT} = \frac{\varphi_\Sigma + \varphi_\Delta}{2} \qquad (10)$$

Figure 9:
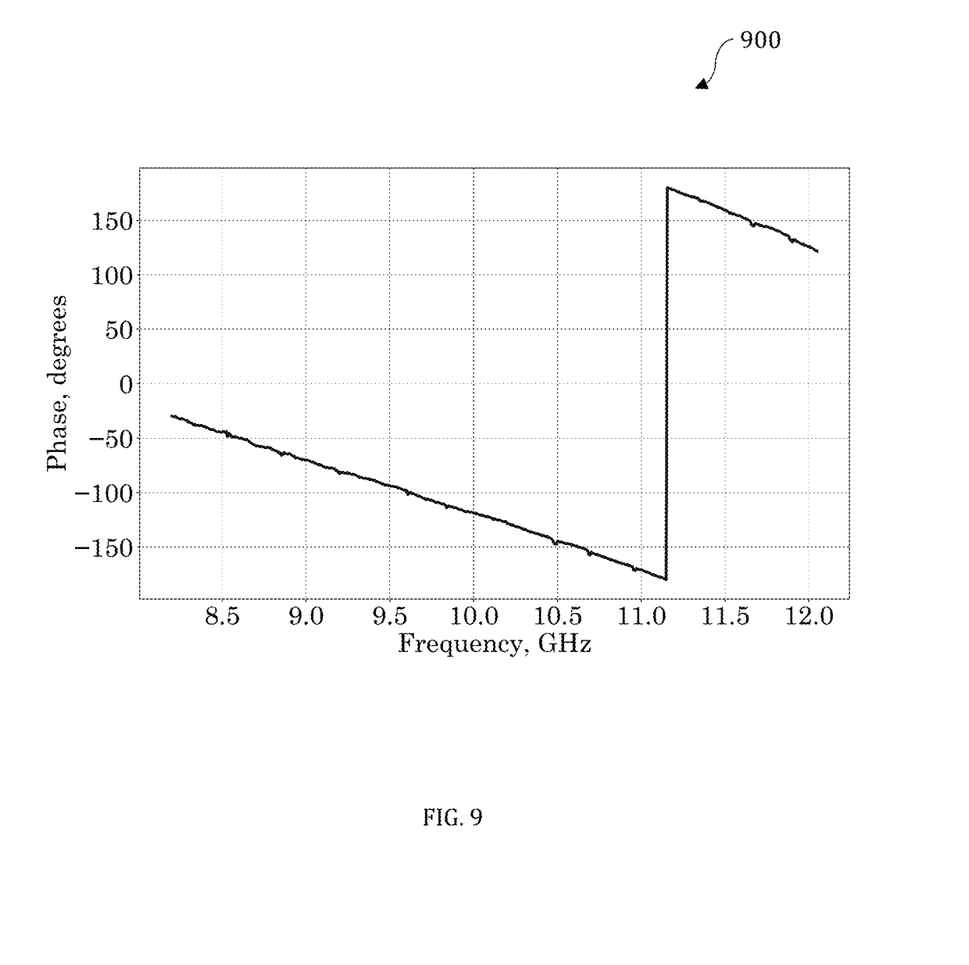
FIG. 9 depicts another chart of phase as a function of frequency, in accordance with disclosed embodiments.

FIG. 9 illustrates a chart 900 of a calculated phase response of a test device 410 (e.g. a mixer under test), as an example of an output that can be provided to a user via a computer system, or other such device. In this example, the frequency grid as used in chart 700 and chart 800, is illustrated. The method ends at 555.

The disclosed embodiments enable characterization of a mixer under test independent from the phase response of an LO signal path, and virtually eliminate phase error caused by inequality of the LO signal paths to the LO ports of the mixer under test and additional mixer. Any residual error can be evaluated. Furthermore, the disclosed method and system evaluate a phase response of an IF channel during sum measurements. The disclosed embodiments can be used to determine the difference between phase responses of a test channel and a reference channel when conducting difference measurements. The disclosed embodiments can be used to determine the difference between phase responses of the mixer under test and the additional mixer independently from the phase responses of the test channel and the reference channel.

The disclosed methods and systems employ only one additional mixer (AM) with a phase response that can be unknown. The only requirement for the additional mixer is reciprocity, which means equal phase responses of that mixer during the frequency conversion from radio frequency (RF) to intermediate frequency (IF) and from IF to RF.

With this requirement, the disclosed embodiments can be used to determine the phase response of a device under test (DUT) over a wide local oscillator (LO) frequency range with a single calibration. The RF and LO signals can be clocked for phase-coherent measurements. Additionally, the disclosed methods and systems can be used to characterize a device under test independently from the phase of an LO signal.

Furthermore, the disclosed embodiments can be employed in a variety of communications systems where the accuracy of a determined phase response is of high importance. Examples of such systems include: satellite communication systems, phased array techniques, wireless communication systems based on phase modulation, and others. In many communications systems, the data transfer bandwidth is limited due to a lack of exact knowledge of the phase response of a mixer. In comparison with prior-art methods and systems, the disclosed embodiments can be used to estimate the phase deviation from linearity, and also to determine the exact value of a phase response of a mixer independently from the phase of an LO signal.

Additionally, the methods and systems disclosed herein are useful for characterizing a response of a mixer for the purposes of accurate computer-aided design modeling of complex networks containing frequency-translating devices. Further, the embodiments can find application in the development of new metrology-grade traceable standards in the area of nonlinear measurements.

Based on the foregoing, it can be appreciated that a number of embodiments, preferred and alternative, are disclosed herein. For example, in one embodiment a system comprises an analyzer connectable to a device under test, an additional device connected to the analyzer and connected to the device under test, a local oscillator connected to the device under test and the additional device, and at least one switch connecting the device under test and the additional device to a vector voltmeter. In an embodiment, the system further comprises a reference generator connected to the vector voltmeter. In an embodiment, the at least one switch comprises at least three switches.

In an embodiment, the device under test comprises a mixer and the additional device comprises an additional mixer. In an embodiment, the mixer comprises a microwave mixer and the additional mixer comprises an additional microwave mixer. In an embodiment, the analyzer comprises a vector network analyzer.

In an embodiment, the system further comprises at least one processor, and a storage device communicatively coupled to the at least one processor, the storage device storing instructions which, when executed by the at least one processor, cause the at least one processor to perform operations comprising: receiving response data from the analyzer, calculating a response of the device under test, and displaying the calculated response of the device under test.

In another embodiment a method comprises measuring a forward sum of a response of a device under test and an additional device, interchanging a position of the device under test and the additional device, measuring a reverse sum of a response of the device under test and the additional device, and calculating a response of the device under test. In an embodiment, the method further comprises measuring a forward test channel response with the device under test connected and measuring a forward reference channel response with the additional device connected.

In an embodiment, the method further comprises measuring a test channel response with the additional device connected and measuring an IF channel response. In an embodiment, the method further comprises calibrating the measurement system.

In an embodiment, the device under test comprises a mixer and the additional device comprises an additional mixer. In an embodiment, the mixer comprises a microwave mixer and the additional mixer comprises an additional microwave mixer.

In yet another embodiment a method comprises: measuring a forward sum of a response of a device under test and an additional device, measuring a forward test channel response with the device under test connected, measuring a forward reference channel response with the additional device connected, interchanging a position of the device under test and the additional device, measuring a reverse sum of a response of the device under test and the additional device, measuring a test channel response with the additional device connected, measuring an IF channel response, and calculating a response of the device under test. In an embodiment, the method further comprises calibrating the measurement system.

In an embodiment, the response comprises a phase response. In an embodiment, the response comprises a magnitude response.

In an embodiment, the device under test comprises a mixer and the additional device comprises an additional mixer. In an embodiment, the mixer comprises a microwave mixer and the additional mixer comprises an additional microwave mixer.

In an embodiment, the method further comprises displaying the calculated response of the device under test with a computer system.

It will be appreciated that variations of the above-disclosed and other features and functions, or alternatives thereof, may be desirably combined into many other different systems or applications. Also, it should be understood that various presently unforeseen or unanticipated alternatives, modifications, variations or improvements therein may be subsequently made by those skilled in the art which are also intended to be encompassed by the following claims.

What is claimed is:

1. A system comprising:
an analyzer connected to a radio frequency port of a device under test wherein said device under test comprises a mixer;
an additional external device connected to said analyzer via a radio frequency port of said additional external device, and connected to said device under test, wherein said additional external device comprises an additional mixer;
a local oscillator connected to a local oscillator port of said device under test and a local oscillator port of said additional external device, via a power divider; and
a first switch connecting said device under test to a second switch, a third switch connecting the additional external device to the second switch, wherein the second switch connects the first switch and the third switch to a vector voltmeter.

2. The system of claim 1 further comprising:
a reference generator connected to said vector voltmeter.

3. The system of claim 1 wherein each of the first switch, the second switch, and the third switch have a first position and a second position.

4. The system of claim 1 wherein said mixer comprises a microwave mixer and said additional mixer comprises an additional microwave mixer.

5. The system of claim 1 wherein said analyzer comprises a vector network analyzer.

6. The system of claim 5 where said system further comprises:
at least one processor; and
a storage device communicatively coupled to the at least one processor, the storage device storing instructions which, when executed by the at least one processor, cause the at least one processor to perform operations comprising:
receiving response data from said vector network analyzer;
calculating a response of said device under test; and
displaying said calculated response of said device under test.

7. A method comprising:
measuring a forward sum of a phase response of a device under test and a phase response of an additional device with a first switch in a second position and a third switch in a first position wherein said device under test comprises a mixer and said additional device comprises an additional mixer;
measuring a phase response of a test channel with the device under test wherein the test channel comprises a path from an IF port of the device under test to an input of a vector voltmeter through a first switch in a first position and a second switch in a first position;
measuring a phase response of a reference channel with the additional device wherein the reference channel comprises a path from an IF port of the additional device to the input of the vector voltmeter through a second switch in a second position and the third switch in a second position;
interchanging a position of said device under test and said additional device in order to preserve a direction of frequency conversion in said device under test and said additional device during a reverse measurement; and place the additional external device in the test channel;
measuring a reverse sum of the phase response of said device under test and the phase response of said additional device with a first switch in a second position and a third switch in a first position;
measuring a phase response of the test channel with the additional device, wherein the test channel comprises a path from an IF port of the additional device to the input of a vector voltmeter through the first switch in the first position and the second switch in the first position;
measuring a phase response of an IF channel with a vector network analyzer; and
calculating a response of said device under test.

8. The method of claim 7 further comprising:
calibrating a measurement system.

9. The method of claim 7 further comprising:
measuring the test channel's phase response relative to an arbitrary phase response generated by a reference generator using the vector voltmeter; and
measuring the reference channel's phase response relative to the arbitrary phase response generated by the reference generator using the vector voltmeter.

10. The method of claim 7 wherein a phase response further comprises a magnitude response.

11. The method of claim 7 wherein said mixer comprises a microwave mixer and said additional mixer comprises an additional microwave mixer.

12. The method of claim 7 further comprising:
displaying said calculated response of said device under test with a computer system.

* * * * *